(12) United States Patent
Marashdeh et al.

(10) Patent No.: US 10,976,286 B2
(45) Date of Patent: Apr. 13, 2021

(54) DIFFERENTIAL MAGNETIC FIELD TOMOGRAPHY

(71) Applicant: Tech4Imaging LLC, Columbus, OH (US)

(72) Inventors: Qussai Marashdeh, Columbus, OH (US); Christopher Zuccarelli, Columbus, OH (US); Jesse Hudak, Columbus, OH (US); Mohd Harish, Columbus, OH (US); Geoffrey Legg, Tewksbury, MA (US)

(73) Assignee: TECH4IMAGING LLC, Columbus, OH (US)

( * ) Notice: Subject to any disclaimer, the term of this patent is extended or adjusted under 35 U.S.C. 154(b) by 172 days.

(21) Appl. No.: 16/335,704

(22) PCT Filed: Oct. 23, 2018

(86) PCT No.: PCT/US2018/056988
§ 371 (c)(1),
(2) Date: Mar. 22, 2019

(87) PCT Pub. No.: WO2019/083923
PCT Pub. Date: May 2, 2019

(65) Prior Publication Data
US 2021/0010973 A1 Jan. 14, 2021

Related U.S. Application Data

(60) Provisional application No. 62/575,691, filed on Oct. 23, 2017.

(51) Int. Cl.
*G01N 27/82* (2006.01)
(52) U.S. Cl.
CPC .................................. *G01N 27/82* (2013.01)
(58) Field of Classification Search
CPC ...................................................... G01N 27/82
See application file for complete search history.

(56) References Cited

U.S. PATENT DOCUMENTS

| 4,908,578 | A | 3/1990 | Van Liere |
| 5,479,100 | A * | 12/1995 | Fowler .................. G01N 27/82 324/220 |
| 5,818,222 | A | 10/1998 | Ramsden |
| 7,038,445 | B2 * | 5/2006 | Walters .................. G01N 27/82 324/240 |
| 8,447,532 | B1 | 5/2013 | Goroshevskiy et al. |
| 8,542,127 | B1 | 9/2013 | Goroshevskiy et al. |
| 8,593,154 | B2 * | 11/2013 | Ross .................. A61B 5/0073 324/600 |

(Continued)

*Primary Examiner* — Dominic E Hawkins
(74) *Attorney, Agent, or Firm* — Standley Law Group LLP; James L. Kwak

(57) ABSTRACT

The present invention uses a plurality of magnetic field sources and magnetic field sensors mounted against a surface. Based on the mass of ferromagnetic material, such as steel, the magnetic field sensors detect variable magnetic field strength and this variance is proportional to the mass of ferromagnetic material being detected. An electronic device reads the magnetic field values and uses the information to quantify the ferromagnetic material in the surface or inside the volume of the construction component.

29 Claims, 14 Drawing Sheets

(56) References Cited

U.S. PATENT DOCUMENTS

| | | | |
|---|---|---|---|
| 8,860,410 B2* | 10/2014 | Petrie | G01R 33/0029 |
| | | | 324/251 |
| 9,784,715 B2* | 10/2017 | Micheau-Cunningham | |
| | | | G01N 27/904 |
| 2004/0041560 A1* | 3/2004 | Walters | G01N 27/82 |
| | | | 324/238 |
| 2009/0271146 A1 | 10/2009 | Ammar | |
| 2010/0127705 A1* | 5/2010 | Scharfetter | A61B 5/05 |
| | | | 324/310 |
| 2012/0119732 A1* | 5/2012 | Rose | G01N 29/2412 |
| | | | 324/240 |
| 2012/0242350 A1* | 9/2012 | Sundaresan | A61B 5/0536 |
| | | | 324/629 |
| 2016/0111192 A1 | 4/2016 | Suzara | |
| 2016/0245737 A1 | 8/2016 | Davis et al. | |
| 2016/0370438 A1* | 12/2016 | Komasaki | H01F 7/0294 |

\* cited by examiner

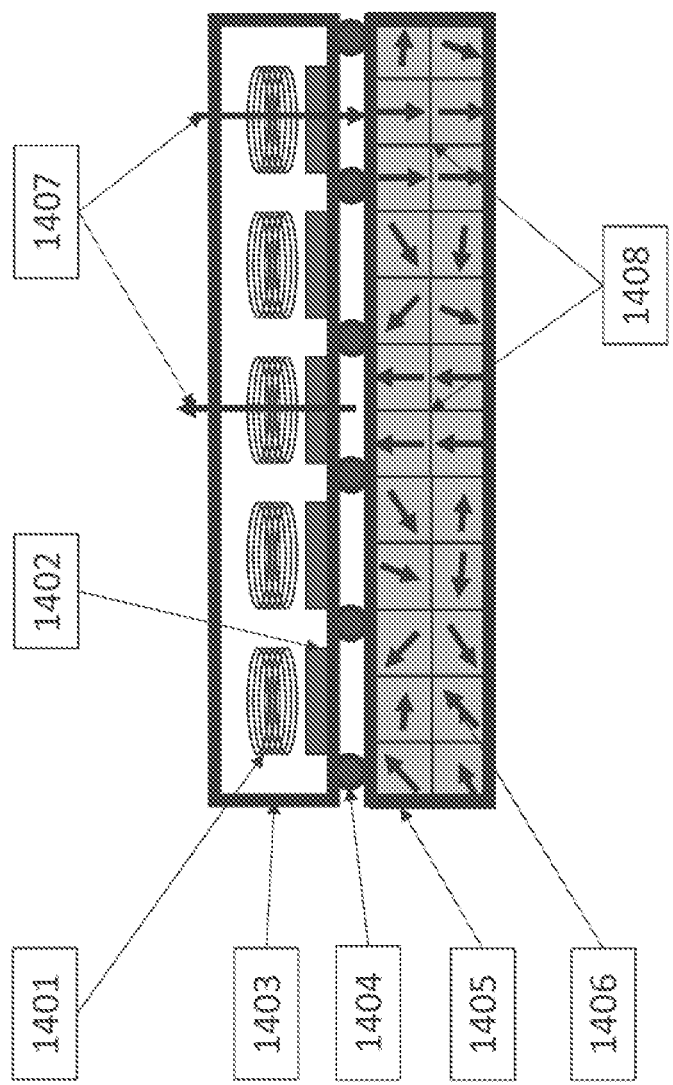

DIFFERENTIAL MAGNETIC FIELD TOMOGRAPHY

BACKGROUND OF THE INVENTIVE FIELD

Loss of metal (especially steel mass), through corrosion or erosion is a major problem in a wide span of industries that include transportation, infrastructure, energy, and oil and gas. It involves oxidization of metal in the case of corrosion or gradual loss of metal through chipping or friction in the case of erosion. Undetected, steel mass loss can cause collapse of buildings or structures, burst of pipelines, or malfunction of tubes. Those faults not only contribute to a significant economic loss, they can also lead to injuries or fatalities.

For example, corrosion in pipelines can lead to degradation of pipe strength and possible ruptures. In infrastructure applications, corrosion in steel can lead to reduction in the load-bearing capability that these structures can handle. This can lead to collapse of buildings made with reinforced steel or bridge failures as pre-stressed tendons give away. Detection of steel mass is especially important in segmental bridges where the bridge's load-bearing ability depends on the steel of pre-stressed tendons. Tendons, in this case, hold the numerous segments of a segmental bridge together. The loading capability of a bridge depends on the number of tendons linking the segments together and the health of the steel inside each tendon. A tendon typically fails when steel strands snap, thus increasing the load on other tendons holding the bridge together. If enough tendons snap, the remaining tendons cannot hold the bridge weight together and a bridge collapse is imminent. Another risk factor for tendons is in the form of steel corrosion. Here, the load-bearing capability is weakened when the steel strands inside the tendons corrode. It is critical to continuously inspect these bridge components for corrosion in the tendons and to detect for failed or broken tendons. Corrosion is brought on by air and moisture in contact with steel, as well as by high chloride content within the grouting or fill material surrounding the steel.

A more common issue is corrosion and damage in steel pipes and plates. Steel pipes and plates are used in an incredibly wide variety of applications across many industries, including power generation and oil and gas industries. These pipes and plates can undergo a lot of wear over time, and internal damage and wall thinning can occur due to corrosion, stress, and abrasion. Extensive corrosion and damage can lead to catastrophic failure if left unrepaired or unchecked. It is therefore important for facility operators to know the status of their steel components, especially in corrosive or abrasive environments. It is also desirable that inspection methods for analyzing these components do not require the component to be taken out of service. A fast, safe, easy-to-use, and noninvasive inspection method is needed in these cases.

Current inspection methods depend on either inaccurate or inefficient technologies. For example, magnetic flux is based on generating magnetic field at one side of the tendon and detecting the strength of that field as it is received from a detector end. This method, being the most viable solution that currently exists, has two major drawbacks. First, it is labor and time intensive as it requires repeatedly winding and unwinding heavy cables. Second, it is not very accurate as the magnetic field detected at the receiver end is typically very low. Another method is based on the use of microwave signals transmitted into the structure. A receiver in this case detects the electromagnetic waves as they bounce back from the steel rods. However, this method also suffers from two major drawbacks: First, the steel rods are typically located relatively near to the surface where the sensors are mounted. This makes deciphering the received signals from multiple reflections difficult, and thus accuracy is reduced. Second, this method is more suited to detecting if steel rods are present or not, but it cannot accurately detect corrosion of steel mass.

Existing inspections methods also involve using magnetometers to measure magnetic field from a ferromagnetic material and then infer corrosion or erosion. In prior art (U.S. Pat. Nos. 8,542,127 and 8,447,532), a magneto meter is used to measure the change in magnetic field in a material when subjected to mechanical stress. This method requires applying pressure on the inspected material and is typically suitable to pressurized pipes. In another prior art (US 2016/0245737), magnetometers are used to detect residual magnetic field in pipes. The change in residual magnetic field is inferred as a result of corrosion or erosion. This method does not use any magnetic source and relies only on measurement of residual magnetic fields when the pipes are manufactured or installed.

In the present invention, magnetometers are used with an active magnetic field source. The active magnetic field source energizes the object being inspected with beams of magnetic field. Those beams erase or mitigate residual magnetic fields in the inspected objects and writes a magnetic signal in place. The residual magnetic field measured after writing the new magnetic signal is used to infer the total mass of ferromagnetic material in the inspection domain. The inspection here is based on differential magnetic field measurement where the magnetic field is measured when the magnets are activated and after the magnets are deactivated. The difference between those measurements is used to infer the total mass of ferromagnetic material in the measurement domain. Specifically, the new invention uses a magnetic field sensor and a magnetic source mounted against a surface. Based on the mass of ferromagnetic material—such as steel—inside a volume, the magnetic field sensor detects different magnetic fields when the source is activated. An electronic device reads this measurement and uses the information to quantify the ferromagnetic material inside the volume. The present invention also allows for imaging the distribution of ferromagnetic material using image reconstruction techniques developed for soft field tomography modalities.

A further extension of this invention involves the mounting of several magnetic field sensors around the volume being detected. The collective signals from the sensors are used to map the location of ferromagnetic material inside the volume being tested.

The present invention can be applied wherever there is a need to measure the mass of steel of ferromagnetic material in a non-invasive manner. In addition to infrastructure Non-Destructive Testing (NDT), inspection of pipes for detection of corrosion based on the available thickness of steel is also made possible.

The present invention relates to a system and process to obtain a relationship between magnetic field from a magnetization source and the area (or volume) of steel in the imaging domain. In one embodiment, multiple sensors are mounted around cylindrical objects like tendons or pipes. In another embodiment, the magnetic field sensor modules are placed on plane or flat surfaces.

SUMMARY OF THE INVENTION

The invention is an instrument and methodology to non-invasively detect, measure, and analyze ferromagnetic materials such as steel. The instrument consists of a series of external magnetic field generators or coils with magnetometers, or other devices capable of measuring magnetic field strength, arranged in a plane to analyze the surface and interior of a volume. The external magnetic generators fully or partially magnetize ferromagnetic or diamagnetic material. These components can be permanent or electrically-controlled magnets, inductive coils, or other magnetic field generators.

The main theory of operation of the device is activate the magnetic field generator and measure the magnetic field passing through the magnetometer; turn off the magnetic field generator and measure the residual magnetic field using the magnetometer; and finally use the difference between both measurements to infer the presence, total mass, and distribution of ferromagnetic material. The magnetic field strength is measured at various points on the surface of the inspected object using the magnetometers, while the magnetic field generator is activated and when it is turned off. Magnetic field strength measurements can also be made when external magnetic fields are applied around the sensing region, for example by the magnets/components described previously.

By activating these magnets in various activation patterns and at different frequencies, an accurate image of the amount and location of ferromagnetic material in the sensing region can be reconstructed. Thus, the quantity and quality of ferromagnetic material—such as steel—can be determined by this instrument in a fast, efficient, and noninvasive manner. In order to negate magnetic fields that are not part of the measurement apparatus, such as Earth's magnetic field or remanence magnetic field in the ferromagnetic material, the measurement made when no external fields are active (taken after the magnetic field source is turned off) is subtracted from the measurement when an external field is present (taken when the magnetic field generator is on), according to Equation (1):

$$B_{Diff} = B_{Field\ On} - B_{Field\ Off} \quad (1)$$

Because the methodology used to determine steel mass and location primarily depends on these differential measurements and provides images of ferromagnetic material distribution, this technology and imaging methodology is deemed Differential Magnetic Field Tomography, or DMFT.

The image reconstruction methods used in DMFT are similar to those used in other soft field tomography systems, such as the image reconstruction methods used in Electrical Capacitance Tomography (ECT), as illustrated in U.S. Pat. No. 8,614,707 (Wasito et al.).

A DMFT sensor generally consists of n magnetic sensors placed around the region of interest, providing $(n^2)(n-1)/2$ independent magnetic measurements used for image reconstruction. There are $n(n-1)/2$ possible magnetic activations; where each activation involves a pair of magnetic field source. Each activation provides n magnetic measurements; one from each magnetic sensor. A sensitivity matrix is established where the magnetic field distribution for each activation is recorded. The activation here involves the shape and duration of electric current used to establish a magnetic field, through the coils, before conducting a measurement. Since measurements in DMFT are conducted after the activation is turned off, the measured residual magnetic field in the imaging domain is measured using the magnetic field sensors. The strength of those measurements enables establishing a map of magnetic material distribution. The sensitivity matrix can be obtained through computer simulations or actual measurements.

The linearization technique using the so-called sensitivity model, or sensitivity matrix, is based on the electrical network superposition theorem in which the domain (the cross section of the sensor) is subdivided into a number of pixels, and the response of the sensor becomes a sum (linear model) of interactions when the permittivity of only one pixel in the domain is changed by a known amount. This is similar to the first order series expansion approach for "hard field" tomography.

For magnetic measurements, it can then be written in matrix expression as:

$$B = SG$$

where B is the M-dimension magnetic measurements data vector, G is the N-dimension image vector. N is the number of voxels in the three-dimensional image, and M is the number of magnetic measurements from magnetic sensors for all possible magnetic-pair excitation combinations. Specifically, N is equal to $n \times n \times n_L$, where n is the number of voxels in one side of the image frame (layer), and $n_L$ is the number of layers. The sensitivity matrix S has a dimension of M×N.

The image reconstruction process is an inverse problem involving the estimation of the magnetic material distribution from the measured magnetic data. The image can be calculated:

$$G = S^T B$$

To obtain a sharper reconstructed image, usually an iterative method is employed. The iterative image reconstruction process involves finding methods for estimating the image vector G from the measurement vector B and to minimize the error between the estimated and the measured magnetic data. Iterative techniques include the Landweber technique, also called iterative linear back projection (ILBP), which is a variance of a steepest gradient descent technique commonly used in optimization theory.

Other techniques based on Tikhonov regularization, simultaneous algebraic reconstruction technique (ART) and simultaneous iterative reconstruction technique (SIRT) can also be used. Most techniques use a single criterion, i.e., least square error function. However, the lack of information concerning the nature of a desirable solution when the least square error is used alone does not necessarily give rise to an accurate image. More than one objective function may be required to be considered simultaneously in order to choose the best compromise solution or the best probability of the answer among possible alternatives.

In the case of the present invention, DMFT, these same image reconstruction methods can be used as DMFT is a soft field tomography technique. The sensitivity matrix S has a dimension of M×N. The sensitivity matrix relates to magnetic field distribution in the sensing region.

The present invention has the advantage of not relying on past magnetization remanence of the inspected material. As the magnetic field generators can be operated at different frequencies, and the hysteresis curve of a ferromagnetic material changes as a function of frequency, the present invention can be used to detect the ferromagnetic material grade of steel used in a structure by measuring the hysteresis curves and comparing them to curves of different ferromagnetic materials.

The present invention also enables using multiple magnetic field generators in different formations on the surface of the inspected object. Such flexibility allows focusing of the magnetic field at certain cross-sections across the inspected object. The plurality of magnetic field generators and magnetometers also allows employing image reconstruction algorithms for inverse solving the magnetometers differential measurements to tomograms (images) of ferromagnetic material distributions.

To determine the total amount of ferromagnetic material inside the sensing region, the following equation can be utilized:

$$Ma = AB_{diff} + C$$

where Ma is the mass of ferromagnetic material (in kilograms for example), A is a constant, $B_{diff}$ is the differential magnetic field measurements obtained by the DMFT device, and C is a constant. If there are n DMFT measurements, A and $B_{diff}$ become vectors of length n. This approach relies on first order fitting of measured data to estimated mass. However, the equation can be extended into higher orders depending on the activation pattern and material properties:

$$Ma = AB^2_{diff} + CB_{diff} + D$$

where A, C, and D are constants.

While polynomial equations such as Equations (15), (16), and (17) can be utilized to determine ferromagnetic material mass, other types of equations can also be used. The equation may be exponential, logarithmic, or involve a combination of mathematic operations to convert the captured DMFT measurements into a quantitative, easily-understood measure of ferromagnetic material mass. Complex statistical or machine learning algorithms may also be utilized to achieve this result.

The present invention also allows magnetic field generators to write the results of each inspection and tag each structure at locations where faults have been detected. In this embodiment, the magnetometers magnetize different parts of the structure with binary magnetizations that are retained, through the ferromagnetic materials magnetizations remanence. Reading those binary signals, using magnetometers, allows inspectors to read details of previous inspections and locations of detected faults.

The present invention also uses the size of hysteresis curves at a particular frequency and magnetic field generator strength to infer total mass of steel in the inspected structure. The present invention here does not rely on prior magnetization remanence and thus does not require normalization.

In one embodiment, the present invention is a system for sensing ferromagnetic material in a volume, the system comprising: a plurality of directional magnetic field sensors, a plurality of magnetic field sources or generators, a processing system in electrical communication with the plurality of magnetic sensors and sources, this system being programmed with one or more software routines executing on the remote processing system for: 1) activating the plurality of magnetic sources; 2) measuring the directional magnetic field strength by each of the plurality of magnetic sensors; and 3) determining the amount and location of ferromagnetic material in or within the volume. It is also preferred that the processing system be programmed with one or more software routines executing on the remote processing system for using the magnetic field measurements to reconstruct a volume image of ferromagnetic material.

In another embodiment, the present invention is a system for sensing ferromagnetic material in a volume, the system comprising: a plurality of directional magnetic field sensors, a plurality of magnetic field sources or generators, a processing system in electrical communication with the plurality of magnetic sensors and sources, this system being programmed with one or more software routines executing on the remote processing system for: 1) activating the plurality of magnetic sources; 2) measuring the directional magnetic field strength by each of the plurality of magnetic sensors; 3) deactivating the magnetic field sources; 4) measuring the magnetic remanence from the inspected structure; 5) taking the difference between the first and second measurements and 6) using the difference to determining the amount and location of ferromagnetic material in or within the volume. It is also preferred that the processing system be programmed with one or more software routines executing on the remote processing system for using the magnetic field measurements to reconstruct a volume image of ferromagnetic material.

In another embodiment, the present invention is a system for sensing ferromagnetic material in a volume, the system comprising: a plurality of directional magnetic field sensors, a plurality of magnetic field sources or generators, a processing system in electrical communication with the plurality of magnetic sensors and sources, this system being programmed with one or more software routines executing on the remote processing system for: 1) activating the plurality of magnetic sources with a first frequency and measuring the hysteresis curve of the inspected structure; 2) measuring the directional magnetic field strength by each of the plurality of magnetic sensors; 3) activating the plurality of magnetic sources with a second frequency and measuring the hysteresis curve of the inspected structure; 4) taking the difference between the first and second hysteresis curves 5) Using known hysteresis curves of different materials to infer the ferromagnetic material type or grade from the measured hysteresis difference. It is also preferred that the processing system be programmed with one or more software routines executing on the remote processing system for using the magnetic field measurements to reconstruct a volume image of ferromagnetic material.

In another embodiment; the plurality of magnetic sources or field generators are used to write binary information through different magnetization of the structure by the plurality of magnetic sources. The binary signals can contain information of the inspected structure, date, and location of faults.

In one embodiment, the magnetic sources are DC electromagnets, the field strength and polarity of which can be varied by controlling the current running through the magnets.

In another embodiment, the magnetic sources produce alternating magnetic fields with tunable frequencies, amplitudes, and phase shifts. With this activation scheme, many more magnetic field measurements can be made with the same instrument, thus increasing the instrument's resolution in detecting and imaging ferromagnetic material. Unique material responses to certain magnetic field frequencies can be investigated as well in this embodiment. In particular, alternating current bias can be applied to the electromagnets in order to excite magnetic domains to the linear portion of their B-H (flux density-field strength) characteristic curve, thereby improving sensitivity to small anomalies.

In another embodiment, multiple magnetic sources can be activated at the same time. Each magnetic source can be controlled and adjusted individually, so that each source can have its own unique amplitude and direction of magnetic field in a DC embodiment, or its own unique amplitude, frequency, and phase shift in an AC embodiment. By allowing individual control of each magnetic source, sensitivity of the instrument to different regions in the imaging domain can be adjusted, thus improving its accuracy and versatility without the need for additional hardware. In particular, opposing pairs of electromagnets can be driven differentially to improve penetration and sensitivity to deeper subsurface anomalies.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 14 illustrates one embodiment of the instrument for use in encoding binary information within a ferromagnetic structure for later reference.

DETAILED DESCRIPTION OF EXEMPLARY EMBODIMENT(S)

The following detailed description of the example embodiments refers to the accompanying figures that form a part thereof. The detailed description provides explanations by way of exemplary embodiments. It is to be understood that other embodiments may be used having mechanical and electrical changes that incorporate the scope of the present invention without departing from the spirit of the invention.

Figure 1:
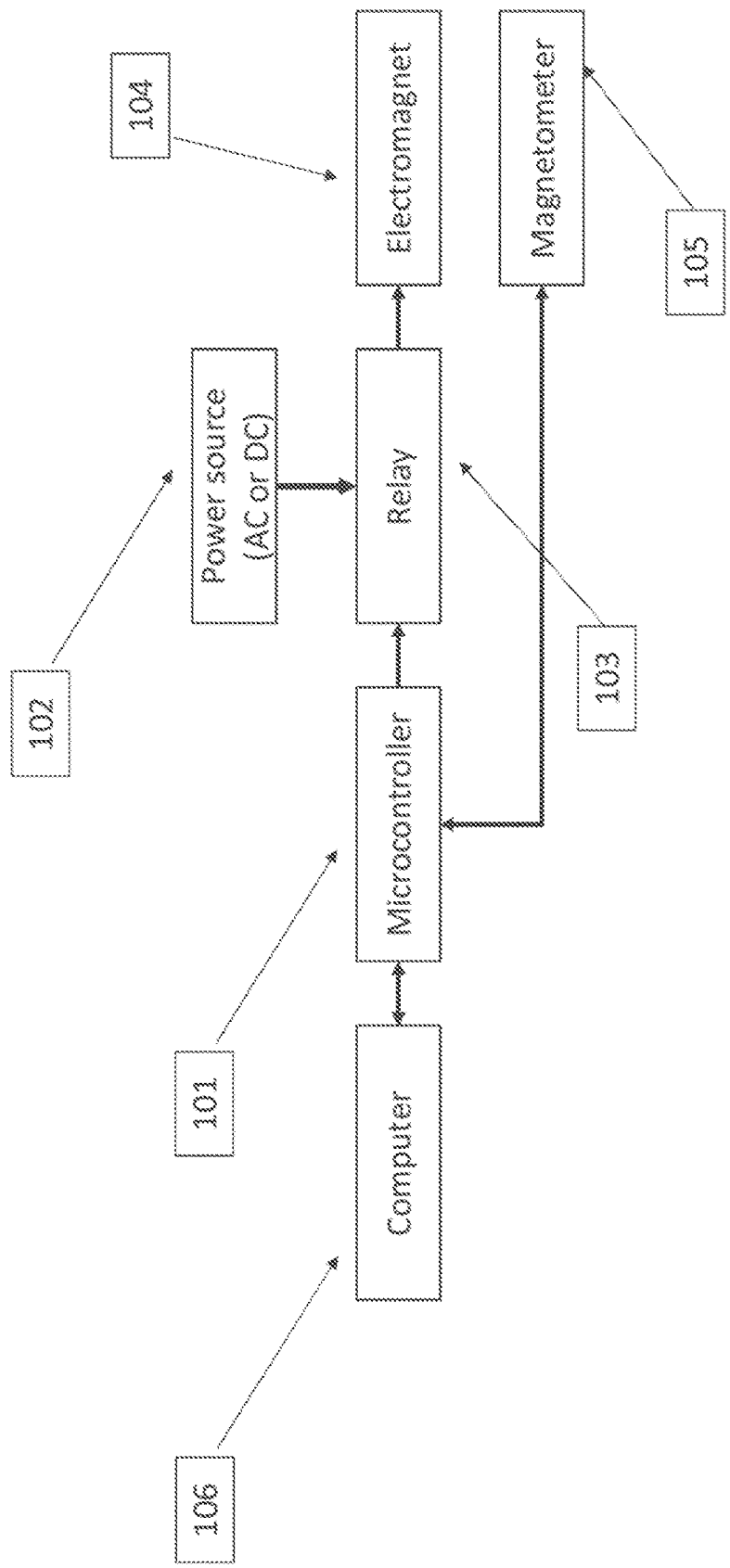
FIG. 1 illustrates a block diagram of the major components involved with the tomography technique and instrument.

FIG. 1 illustrates a block diagram of the major components involved with the tomography technique and instrument. A processing system (101) controls and collects data from the rest of the instrument. A power source (102) supplies power to control switches (103), which are activated and deactivated by the processing system (101). The control switches (103) in turn provide power to a plurality of magnetic sources (104), e.g., magnetic field sources. The processing system (101) reads magnetic field data from a plurality of magnetic sensors (105), e.g., magnetometer. An external computer or other processing unit (106) can be used to interface with the processing system (101) and monitor and record its outputs.

Figure 2:
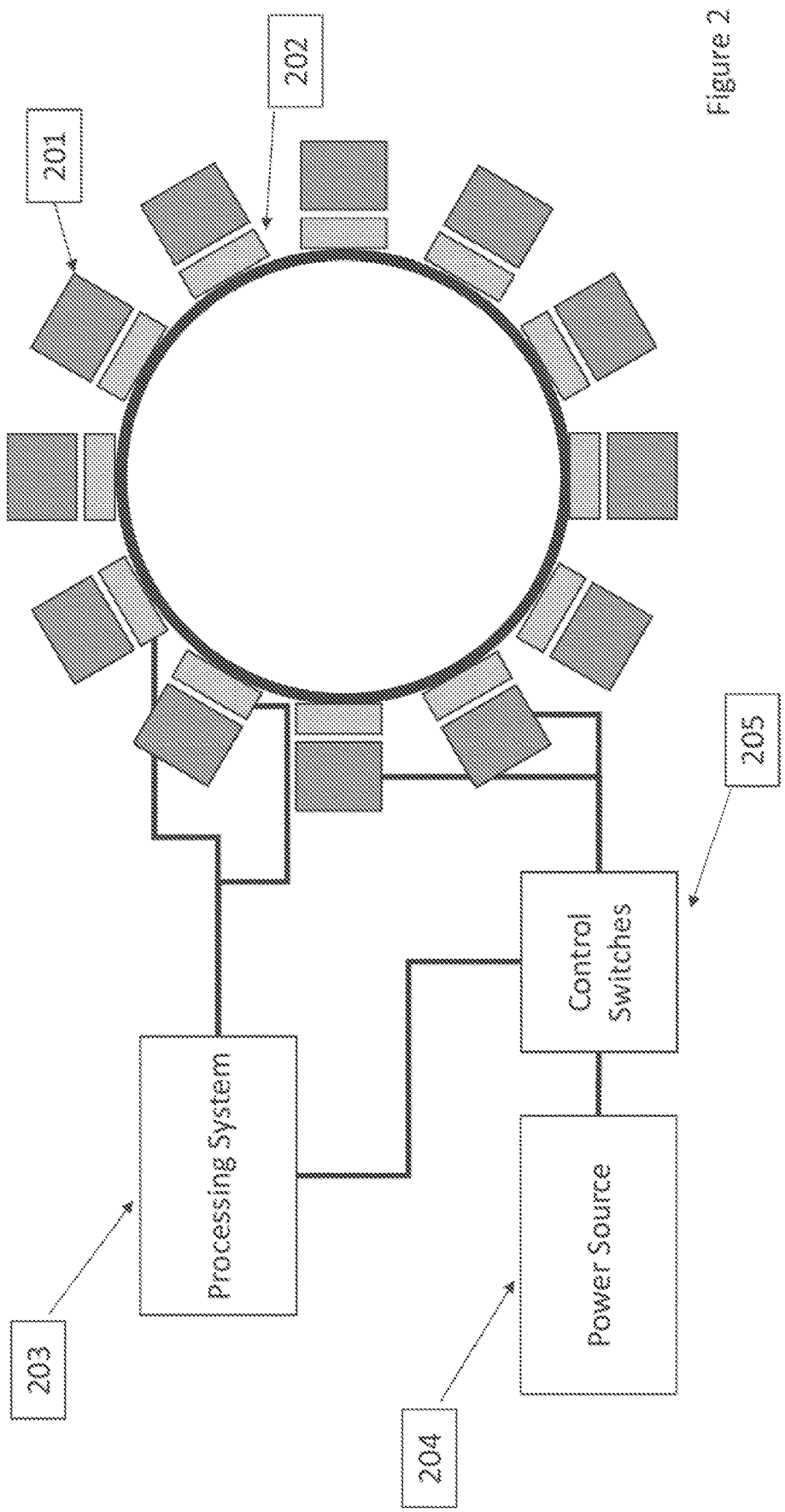
FIG. 2 illustrates the major components of the instrument, including a cylindrical version of the sensor connected to the control units.

FIG. 2 illustrates the major components of the instrument, including a round version of the sensor connected to the control units. A plurality of magnetic sources (201) and magnetic sensors (202) are placed in a round configuration. A processing system (203) controls and collects data from the rest of the instrument. A power source (204) supplies power to control switches (205), which are activated and deactivated by the processing system (203). The control switches (205) in turn provide power to the plurality of magnetic sources (201). The processing system (203) reads magnetic field data from the plurality of magnetic sensors (202).

Figure 3:
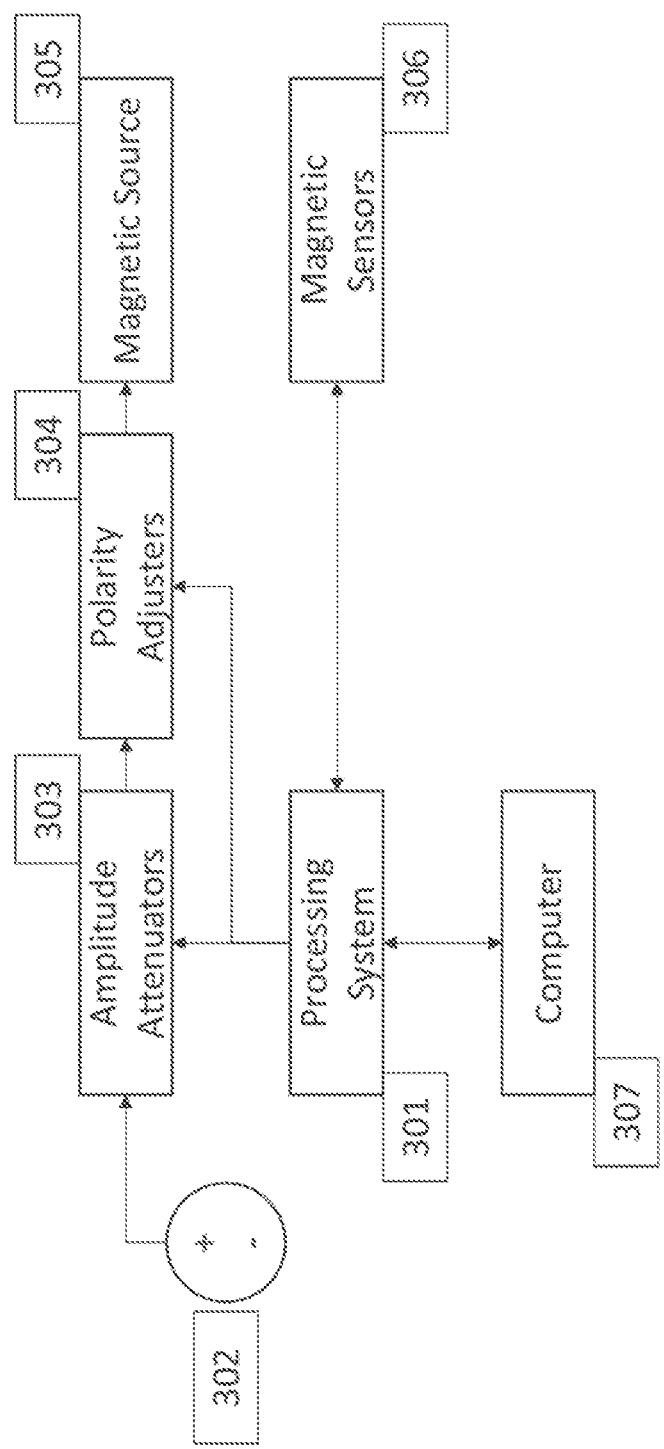
FIG. 3 illustrates a block diagram of the instrument when utilizing DC magnetic fields and measurements.

FIG. 3 illustrates a block diagram of the instrument as utilizing DC magnetic fields and measurements. A processing system (301) controls and collects data from the rest of the instrument. A DC power source (302) supplies DC power. The processing system (301) controls amplitude attenuators (303) and polarity adjusters (304) that tune the DC power being sent to a plurality of magnetic sources (305). The processing system (301) reads magnetic field data from a plurality of magnetic sensors (306). An external computer or other processing unit (307) can be used to interface with the processing system (301) and monitor and record its outputs.

Figure 4:
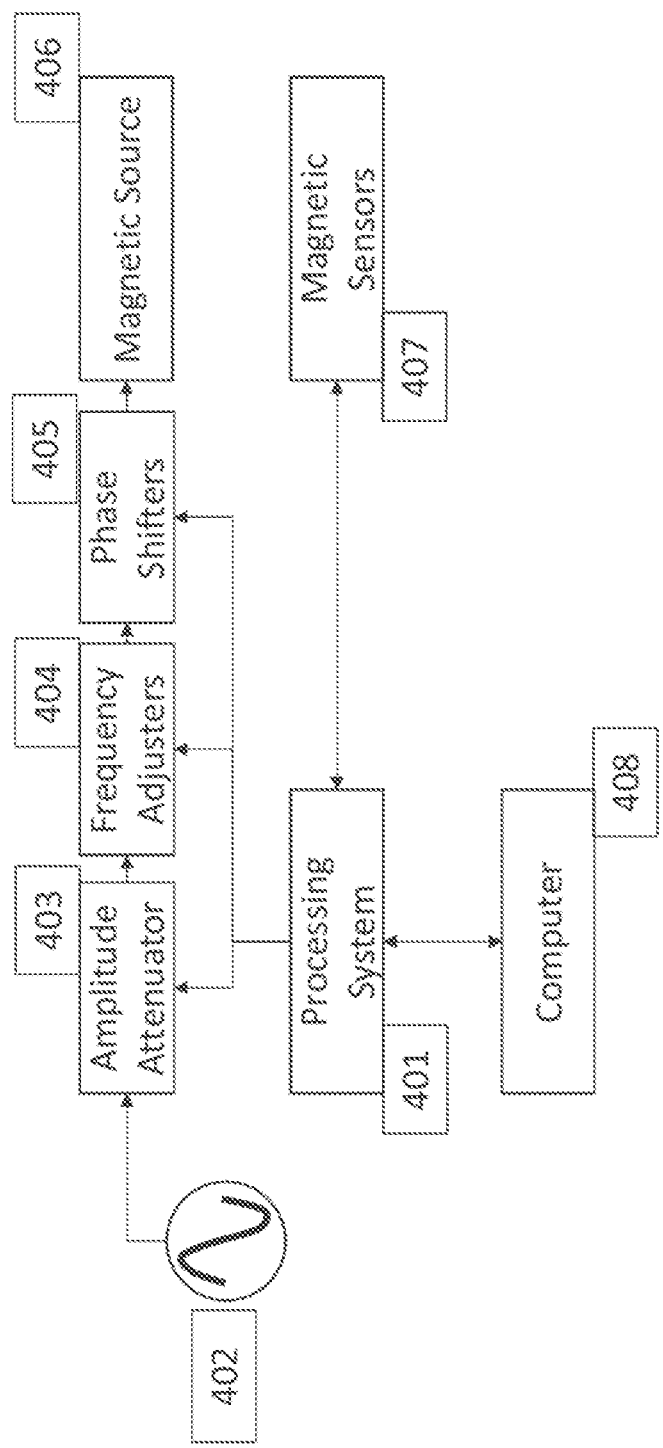
FIG. 4 illustrates a block diagram of the instrument when utilizing AC magnetic fields and measurements.

FIG. 4 illustrates a block diagram of the instrument as utilizing AC magnetic fields and measurements. A processing system (401) controls and collects data from the rest of the instrument. An AC power source (402) supplies AC power. The processing system (401) controls amplitude attenuators (403), frequency adjusters (404), and phase shifters (405) that modify the AC power being sent to a plurality of magnetic sources (406). The processing system (401) reads magnetic field data from a plurality of magnetic sensors (407). An external computer or other processing unit (408) can be used to interface with the processing system (401) and monitor and record its outputs.

Figure 5:
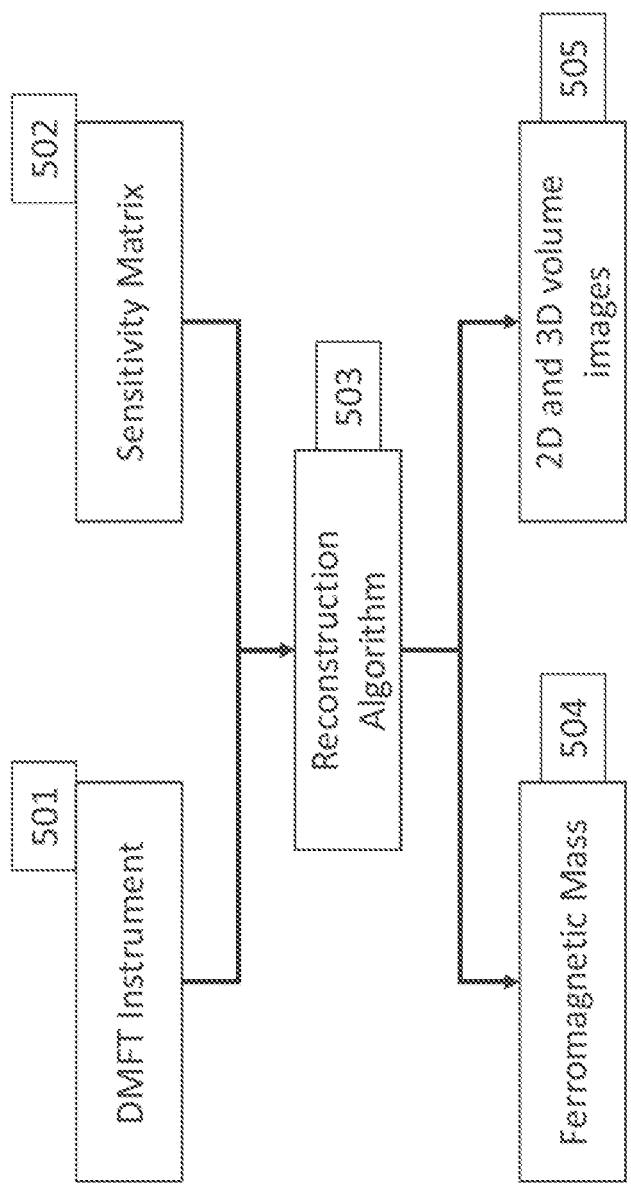
FIG. 5 illustrates an overview of the measurement and reconstruction techniques used to capture data from the instrument and decipher it into information about the quantity and location of ferromagnetic material.

FIG. 5 illustrates an overview of the measurement and reconstruction techniques used to capture data from the instrument and decipher it into information about the quantity and location of ferromagnetic material. The DMFT instrument captures measurements (501). A matrix which relates these measurements to certain regions of interest in the sensing volume, which is referred to as the sensitivity matrix (502), is constructed prior to the measurement period. The DMFT measurements (501) and the sensitivity matrix (502) are fed into a reconstruction algorithm (503), stored either within the system's internal processor or an external processor. This algorithm outputs the mass of ferromagnetic material (504) and the distribution of the material as a 2D or 3D image (505).

Figure 6:
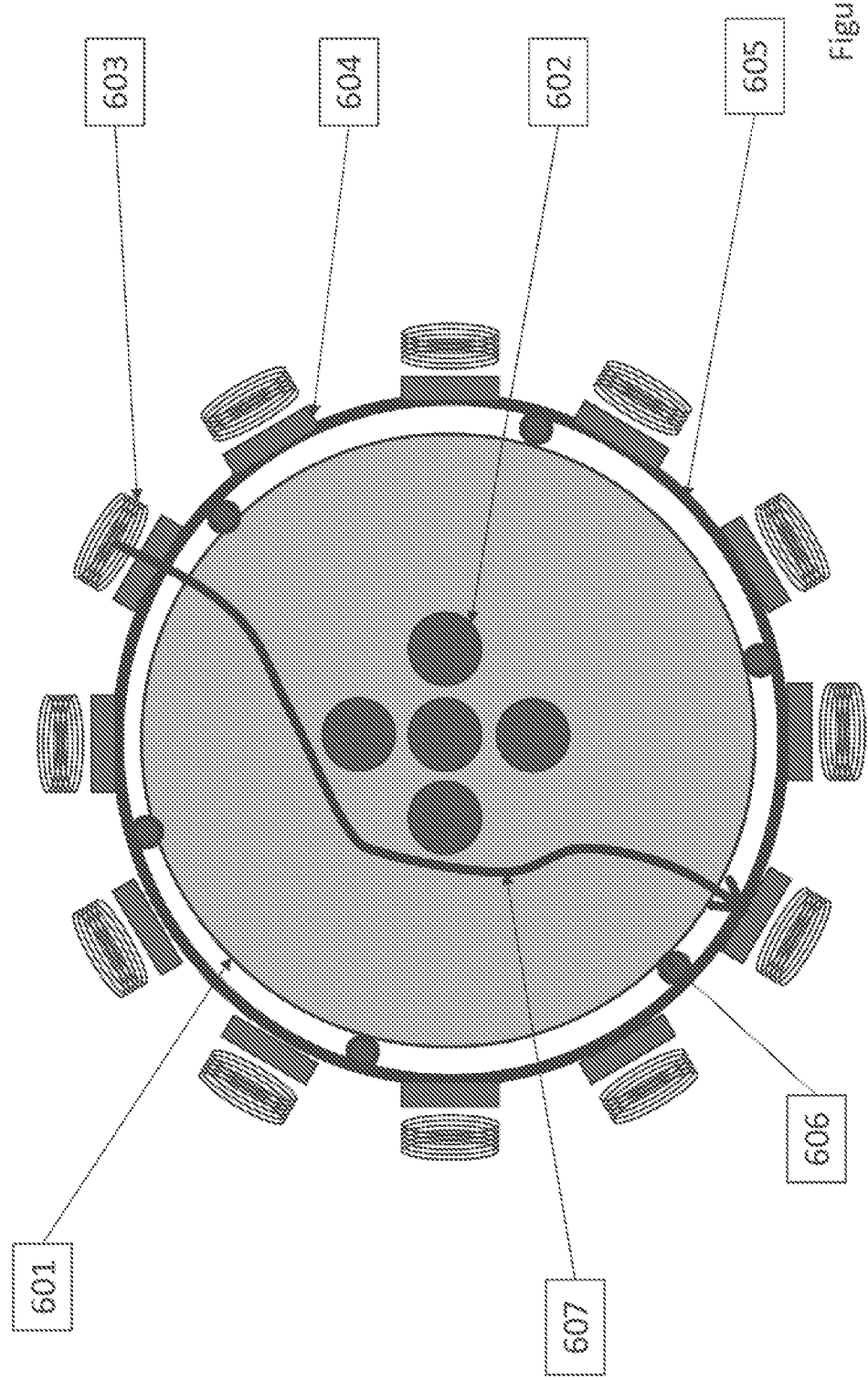
FIG. 6 illustrates a cylindrical version of the sensor portion of the instrument, which is placed on the exterior of a round volume containing ferromagnetic material.

FIG. 6 illustrates a round version of the sensor portion of the instrument, which is placed on the exterior of a round volume containing ferromagnetic material. A structure (601) contains ferromagnetic components (602). The DMFT sensor is comprised of a plurality of magnetic sources (603) and magnetic sensors (604) that are placed around the structure. These components are held in place by a chassis (605) made of non-ferrous material. This chassis (605) can include rollers, wheels, bearings, or other components (606) that allow the instrument to move freely along the structure (601). During operation, the magnetic sources (602) send magnetic fields (607) through the region of interest. These fields (607) are detected and analyzed by the magnetic sensors (604). These readings are used to determine the location and quantity of the ferromagnetic material (602).

Figure 7:
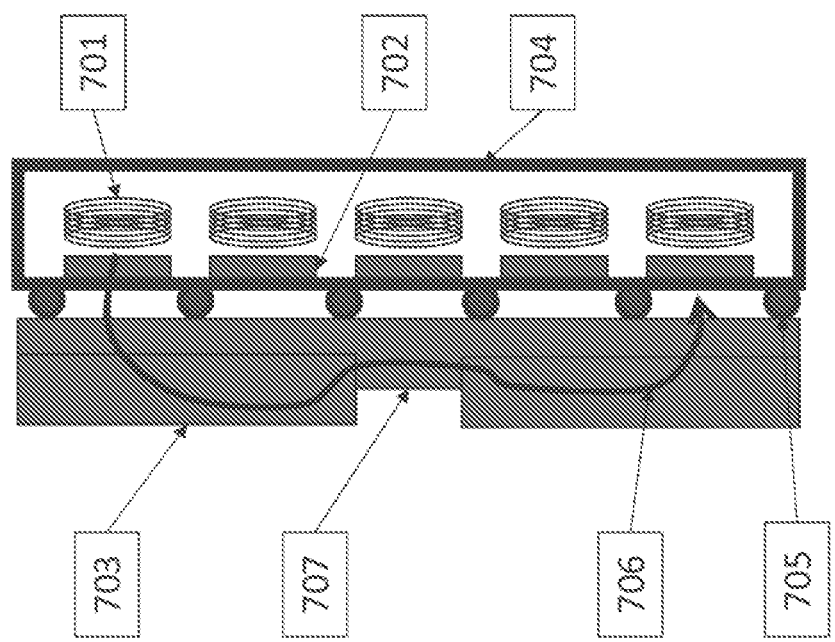
FIG. 7 illustrates a flat version of the sensor portion of the instrument, which is placed on the exterior of a plate or pipe made of ferromagnetic material.

FIG. 7 illustrates a flat version of the sensor portion of the instrument, which is placed on the exterior of a plate or pipe made of ferromagnetic material. The DMFT sensor is comprised of a plurality of magnetic sources (701) and magnetic sensors (702) that are placed on the surface of the structure (703). These components are held in place by a chassis (704) made of non-ferrous material. This chassis (704) can include rollers, wheels, bearings, or other components (705) that allow the instrument to move freely along the structure (703). During operation, the magnetic sources (701) send magnetic fields (706) through the structure (703). These fields (706) are detected and analyzed by the magnetic sensors (702). These readings are used to determine the thickness of the structure (703) at a multitude of points. Thinning caused by corrosion, abrasion, or erosion (707) is detected by measuring a variance in the magnetic fields (706).

Figure 8:
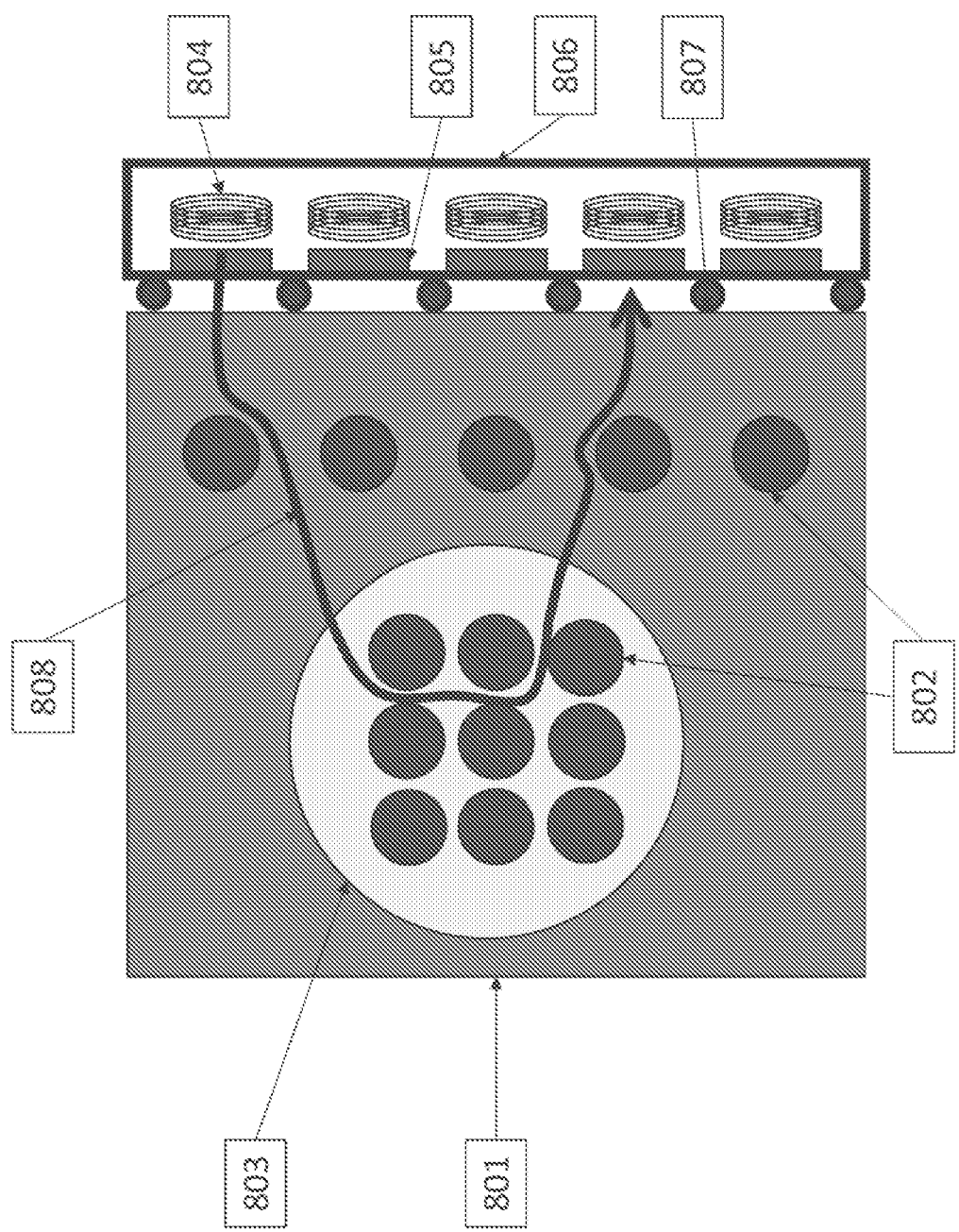
FIG. 8 illustrates another flat version of the sensor portion of the instrument, which is placed on the exterior of a structure containing ferromagnetic material embedded in another medium.

FIG. 8 illustrates another flat version of the sensor portion of the instrument, which is placed on the exterior of a structure containing ferromagnetic material embedded in another medium. A structure, made of concrete or another material (801), contains ferromagnetic components (802), which can be further embedded inside of ducts (803) within the structure (801). The DMFT sensor is comprised of a plurality of magnetic sources (804) and magnetic sensors (805) that are placed on the surface of the structure (801). These components are held in place by a chassis (806) made of non-ferrous material. This chassis (806) can include rollers, wheels, bearings, or other components (807) that allow the instrument to move freely along the structure (801). During operation, the magnetic sources (804) send magnetic fields (808) through the region of interest. These fields (808) are detected and analyzed by the magnetic sensors (805). These readings are used to determine the location and quantity of the ferromagnetic material (802).

Figure 9:
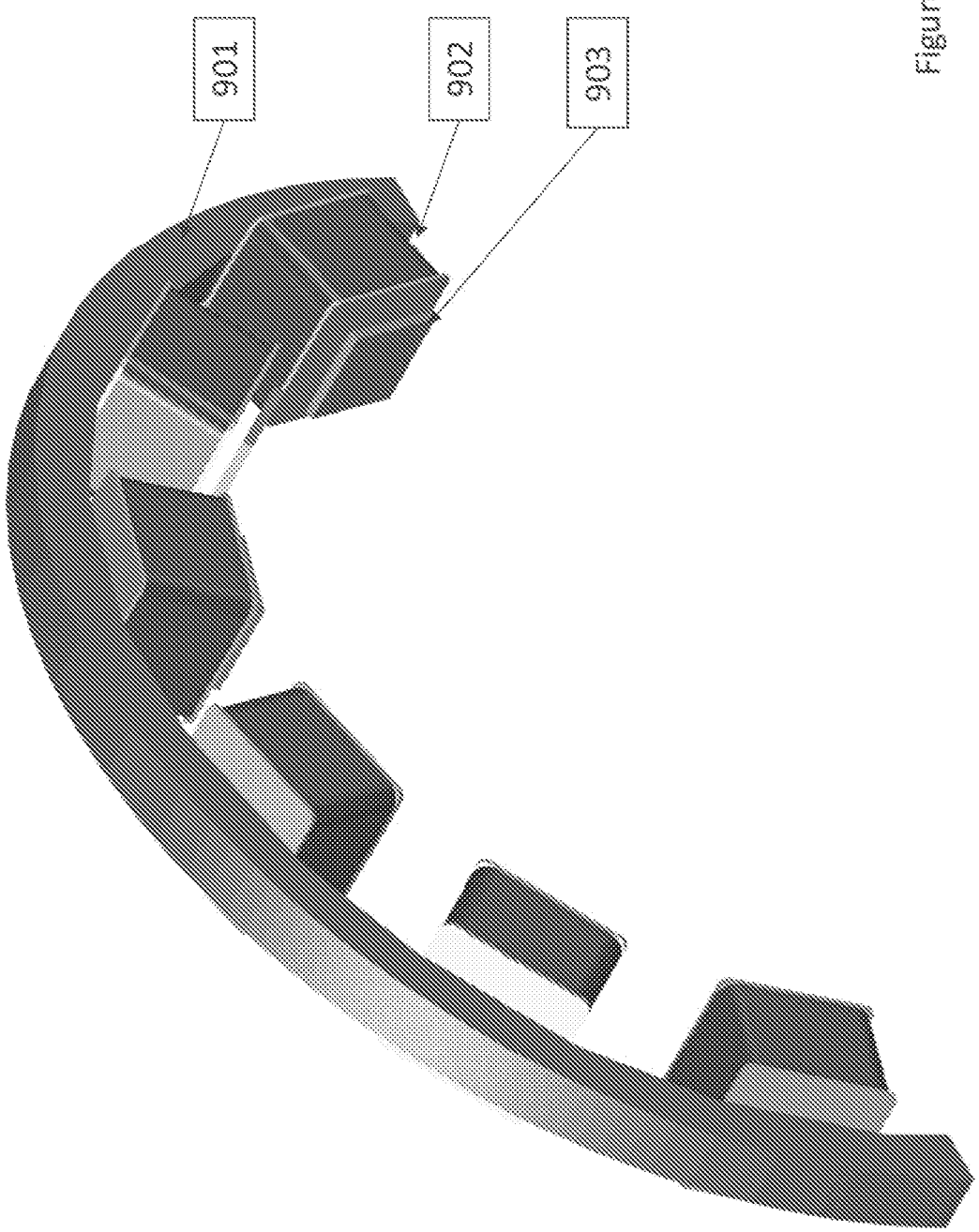
FIG. 9 illustrates one embodiment of a curved sensor portion of the instrument, utilizing coils and a ferromagnetic frame.

FIG. 9 illustrates one embodiment of a round sensor portion of the instrument, utilizing coils and a ferromagnetic frame. A frame made of ferromagnetic material (901) is used to house a plurality of coils (902) and magnetic sensors (903). The ferromagnetic frame (901) serves to concentrate and direct magnetic fields through the sensing region. The coils (902) are wound around ferromagnetic standoffs on the frame (901). The coils (902) are energized with electric power, thus turning the coils (902) into magnetic field sources.

Figure 10:
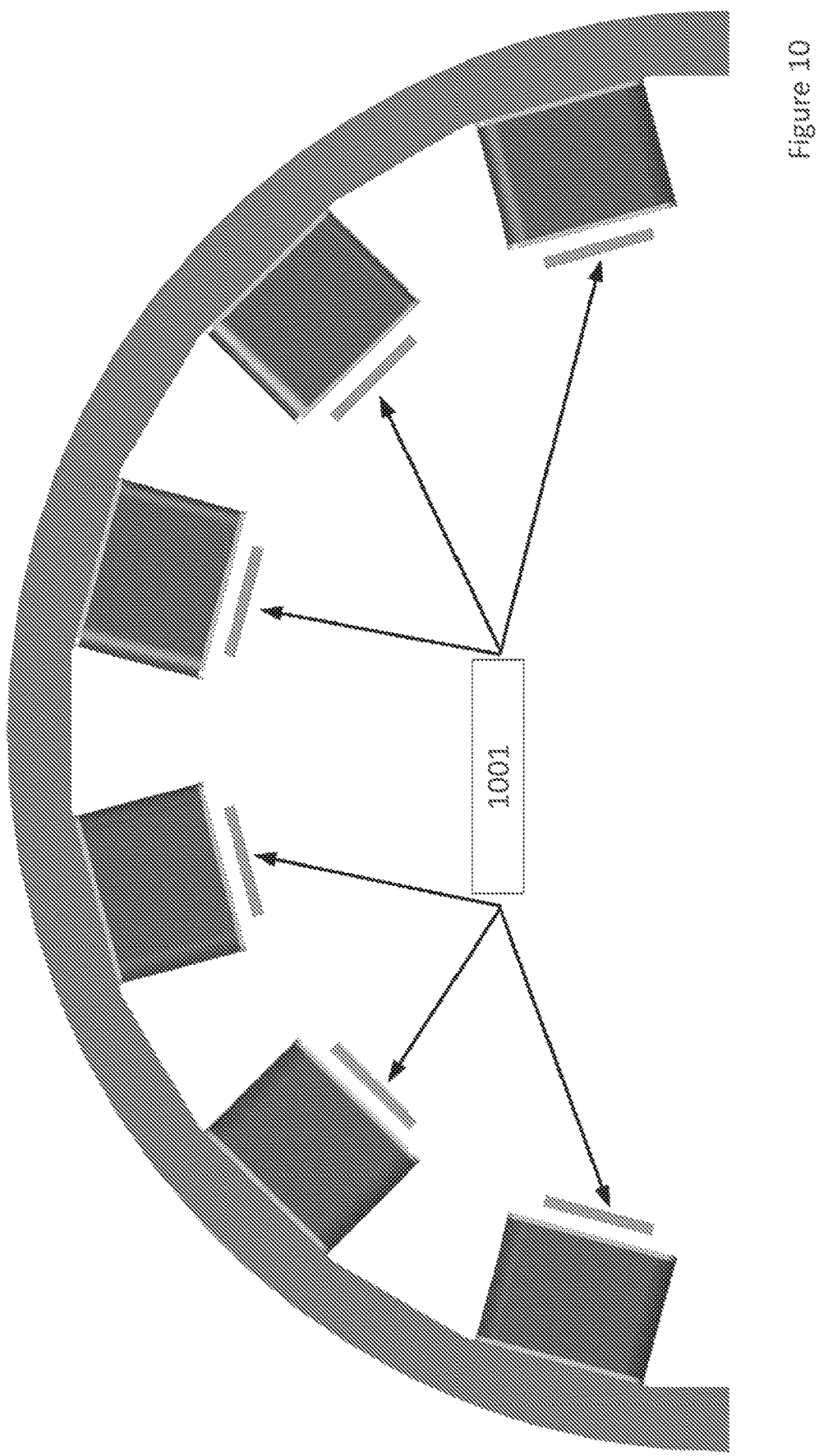
FIG. 10 illustrates the same sensor embodiment as seen in FIG. 9, but from a direct view.

FIG. 10 illustrates the same sensor embodiment as seen in FIG. 9, but from a direct view. Magnetic sensors (1001) are distributed around the sensor frame.

Figure 11:
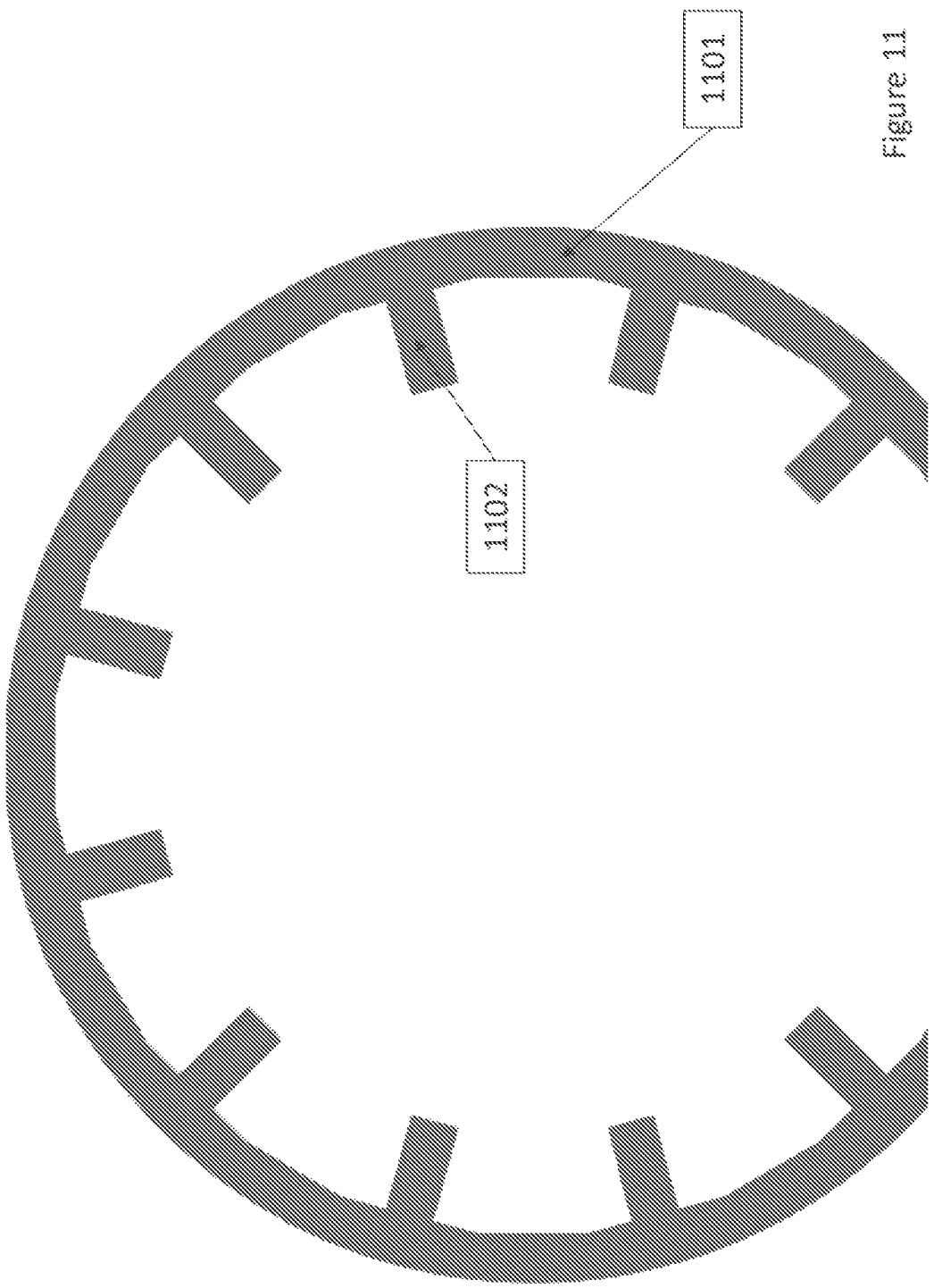
FIG. 11 illustrates one embodiment of the instrument's sensor frame.

FIG. 11 illustrates one embodiment of the instrument's sensor frame. The frame (1101) is made of ferromagnetic material. The frame includes standoffs (1102) comprised of the same material. The rest of the sensor components are located at these standoffs (1102).

Figure 12:
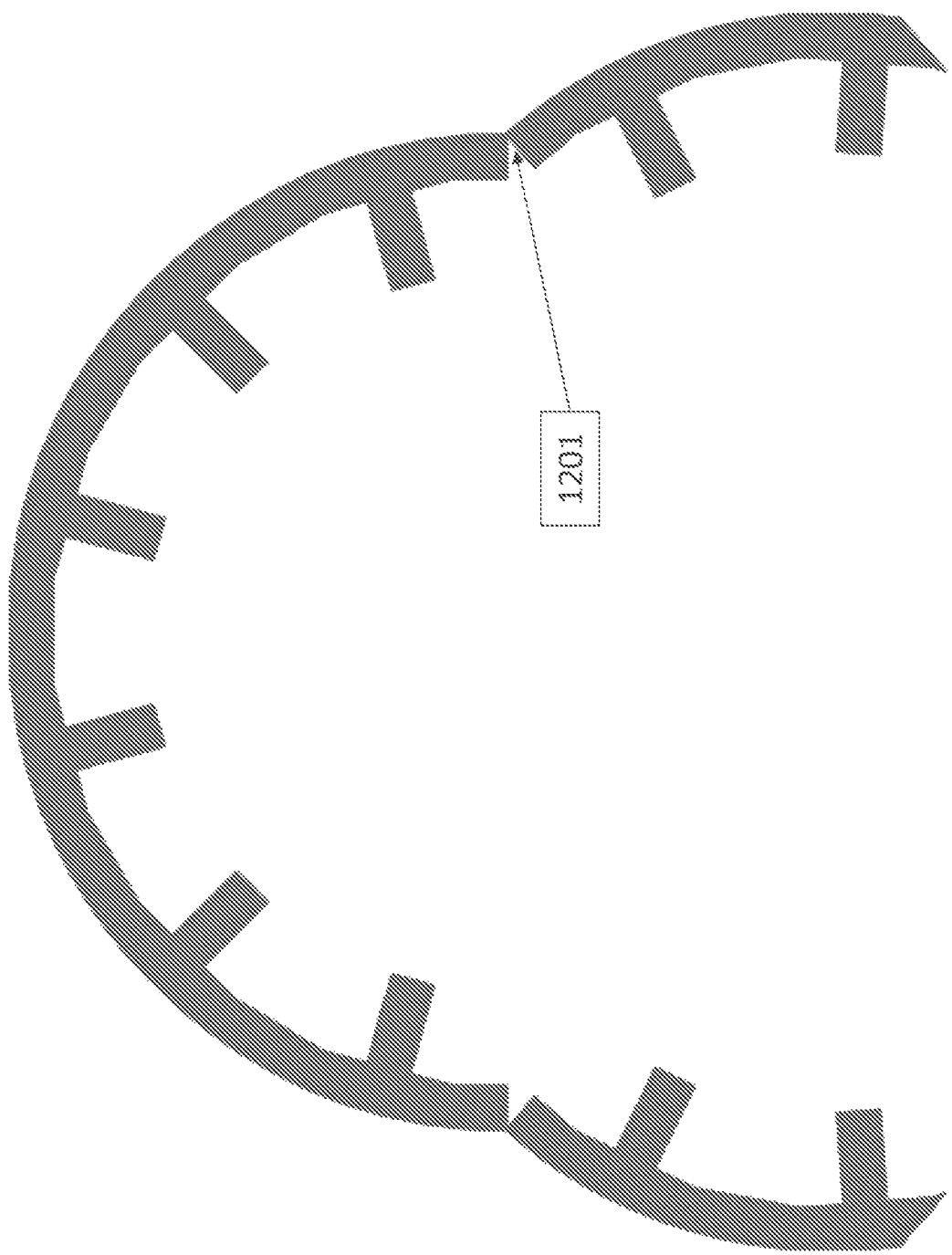
FIG. 12 illustrates the same sensor frame embodiment as seen in FIG. 11, but with part of the frame moved.

FIG. 12 illustrates the same sensor frame embodiment as seen in FIG. 11, but with part of the frame moved. The frame includes hinges or other mechanics (1201) that allow the frame to open and close, allowing it to be placed around structures.

Figure 13:
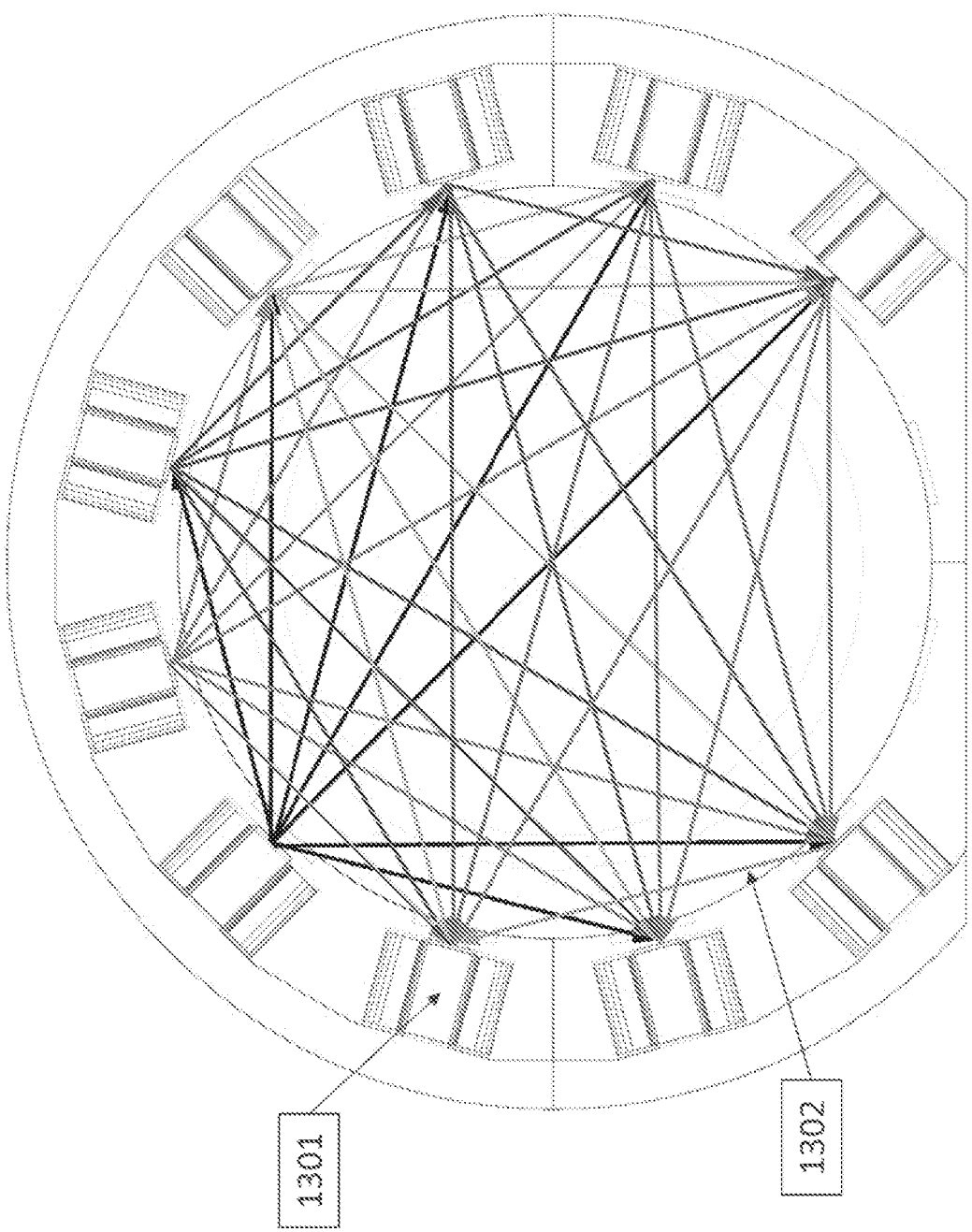
FIG. 13 illustrates the same sensor embodiment as seen in FIG. 9, but with highlighted pathways of magnetic field as it travels throughout the tube or pipe sensing region.

FIG. 13 illustrates the same sensor embodiment as seen in FIG. 9, but with highlighted pathways of magnetic field as it travels throughout the round sensing region. The coil and standoff together form a functioning electromagnet (1301). Each electromagnet produces a magnetic field that propagates through the sensing region towards magnetic sensors, which are also located at the standoffs (1301). There are multiple pathways (1302) that the magnetic field propagates through while traversing the sensing region.

FIG. 14 illustrates one embodiment of the instrument for use in encoding binary information within a ferromagnetic structure for later reference. The instrument consists of a plurality of magnetic sources (1401) and magnetic sensors (1402). These components are housed within a non-ferrous chassis (1403). This chassis (1403) can include rollers, wheels, bearings, or other components (1404) that allow the instrument to move freely. The instrument is placed on or near a structure (1405) containing ferromagnetic material. The material is comprised of many small magnetic domains, each with their own magnetic orientation (1406). These domain magnetizations (1406) can be reoriented by the instrument's magnetic sources (1401). The direction of domain orientation is dictated by the direction of the magnetic sources' field direction (1407), which is controllable. The instrument's magnetic sensors (1402) can then read the orientation of the ferromagnetic material domains (1406). The domain magnetizations can then read as binary information, based on their magnetic orientation direction (1408). This allows the instrument to act as a non-destructive, non-volatile read and write mechanism.

What is claimed is:

1. A system for sensing ferromagnetic material in a volume or structure, the system adapted to be connected to a power source, the system comprising:
    a plurality of directional magnetic field sensors,
    a plurality of magnetic field sources or generators,
    a plurality of switches for connecting the power source to each of the plurality of directional magnetic field sources or generators;
    a hardware processing system in electrical communication with the plurality of magnetic sensors and sources, the hardware processing system being programmed with one or more software routines executing on the hardware processing system for: 1) controlling each of the plurality of switches for activating each of the plurality of magnetic field sources; 2) obtaining sensor measurements from each of the plurality of directional magnetic field sensors; 3) measuring the directional magnetic field strength for each activation of the plurality of magnetic field sources; and 4) determining the amount and location of ferromagnetic material in or within the volume; and
    a chassis made of a non-ferrous material for mounting the plurality of directional magnetic field sensors and the plurality of magnetic field sources or generators, the chassis having wheels or rollers for allowing the chassis to move on the structure being sensed.

2. A system according to claim 1, wherein the hardware processing system is programmed with one or more software routines executing on the hardware processing system for: measuring the directional magnetic field strength after deactivation of each of the plurality of magnetic field sources; and using the difference between the directional magnetic field strength during activation and after deactivation to obtain the amount and location of ferromagnetic material in or within the volume.

3. A system according to claim 1, further comprising a frame for mounting the plurality of directional magnetic field sensors and the plurality of magnetic field sources or generators around the volume or structure being sensed.

4. A system according to claim 3, wherein the frame is hinged for opening.

5. A system according to claim 3, wherein the frame is comprised of a plurality of protrusions for mounting each of the plurality of magnetic field sources or generators.

6. A system according to claim 1, wherein the system is adapted to allow the placement of the plurality of directional magnetic field sensors and the plurality of magnetic field sources or generators in different formations over the surface of the structure being sensed to allow focusing of the magnetic field at certain cross-sections across the sensed structure.

7. A system according to claim 1, wherein the hardware processing system is programmed with one or more software routines executing on the hardware processing system for: tagging the structure being sensed at locations where faults have been detected.

8. A system according to claim 1, wherein the hardware processing system is programmed with one or more software routines executing on the hardware processing system for: controlling the system to magnetize parts of the structure being sensed with binary magnetizations.

9. A system according to claim 1, wherein the plurality of directional magnetic field sensors and the plurality of magnetic field sources or generators are placed in pairs in predetermined locations around the volume or structure being sensed.

10. A system according to claim 1, wherein the magnetic field sources or generators are DC electromagnets, and wherein the field strength and polarity can be varied by controlling current running through the DC electromagnets.

11. A system according to claim 1, wherein the processing system is programmed with one or more software routines executing on the remote processing system for using the magnetic field measurements to reconstruct a volume image of ferromagnetic material.

12. A system according to claim 1, wherein the magnetic field sources or generators produce alternating magnetic fields with tunable frequencies, amplitudes, and phase shifts.

13. A system according to claim 1, wherein multiple magnetic field sources can be activated at the same time and wherein each magnetic field source can be controlled and adjusted individually, so that each magnetic field source can have its own unique amplitude and direction of magnetic field in a DC embodiment, or its own unique amplitude, frequency, and phase shift in an AC embodiment.

14. A system according to claim 1, wherein the plurality of magnetic field sources or generators are adapted to write binary information through different magnetization of the structure and wherein the binary information can contain information of the inspected structure, date, and location of faults.

15. A system for sensing ferromagnetic material in a volume or structure, the system adapted to be connected to a power source, the system comprising:
a plurality of directional magnetic field sensors,
a plurality of magnetic field sources or generators,
a plurality of switches for connecting the power source to each of the plurality of directional magnetic field sources or generators;
a hardware processing system in electrical communication with the plurality of magnetic sensors and sources, the hardware processing system being programmed with one or more software routines executing on the hardware processing system for: 1) controlling each of the plurality of switches for activating each of the plurality of magnetic field sources; 2) obtaining sensor measurements from each of the plurality of directional magnetic field sensors; 3) measuring the directional magnetic field strength for each activation of the plurality of magnetic field sources; 4) deactivating each of the magnetic field sources; 5) measuring the magnetic remnants from the structure; 6) taking the difference between the measured directional magnetic field strength for each activation and the measured magnetic remnants after each deactivation; and 7) using the difference to determining the amount and location of ferromagnetic material in the volume or structure being sensed.

16. A system according to claim 15, further comprising a frame for mounting the plurality of directional magnetic field sensors and the plurality of magnetic field sources or generators around the volume or structure being sensed.

17. A system according to claim 16, wherein the frame is hinged for opening.

18. A system according to claim 16, wherein the frame is comprised of a plurality of protrusions for mounting each of the plurality of magnetic field sources or generators.

19. A system according to claim 15, further comprising a chassis made of a non-ferrous material for mounting the plurality of directional magnetic field sensors and the plurality of magnetic field sources or generators, the chassis having wheels or rollers for allowing the chassis to move on the structure being sensed.

20. A system according to claim 15, wherein the system is adapted to allow the placement of the plurality of directional magnetic field sensors and the plurality of magnetic field sources or generators in different formations over the surface of the structure being sensed to allow focusing of the magnetic field at certain cross-sections across the sensed structure.

21. A system according to claim 15, wherein the hardware processing system is programmed with one or more software routines executing on the hardware processing system for: tagging the structure being sensed at locations where faults have been detected.

22. A system according to claim 15, wherein the hardware processing system is programmed with one or more software routines executing on the hardware processing system for: controlling the system to magnetize parts of the structure being sensed with binary magnetizations.

23. A system according to claim 15, wherein the plurality of directional magnetic field sensors and the plurality of magnetic field sources or generators are placed in pairs in predetermined locations around the volume or structure being sensed.

24. A system according to claim 15, wherein the magnetic field sources or generators are DC electromagnets, and wherein the field strength and polarity can be varied by controlling current running through the DC electromagnets.

25. A system according to claim 15 wherein the processing system is programmed with one or more software routines executing on the remote processing system for using the magnetic field measurements to reconstruct a volume image of ferromagnetic material.

26. A system according to claim 15, wherein the magnetic field sources or generators produce alternating magnetic fields with tunable frequencies, amplitudes, and phase shifts.

27. A system according to claim 15, wherein multiple magnetic field sources can be activated at the same time and wherein each magnetic field source can be controlled and adjusted individually, so that each magnetic field source can have its own unique amplitude and direction of magnetic field in a DC embodiment, or its own unique amplitude, frequency, and phase shift in an AC embodiment.

28. A system according to claim 15, wherein the plurality of magnetic field sources or generators are adapted to write binary information through different magnetization of the structure and wherein the binary information can contain information of the inspected structure, date, and location of faults.

29. A system for sensing ferromagnetic material in a volume or structure, the system adapted to be connected to a power source, the system comprising:

a plurality of directional magnetic field sensors, a plurality of magnetic field sources or generators, a plurality of switches for connecting the power source to each of the plurality of directional magnetic field sources or generators;

a hardware processing system in electrical communication with the plurality of magnetic sensors and sources, the hardware processing system being programmed with one or more software routines executing on the remote processing system for: 1) activating the plurality of magnetic field sources or generators with a first frequency and measuring the hysteresis curve of the structure; 2) measuring the directional magnetic field strength by each of the plurality of magnetic sensors; 3) activating the plurality of magnetic field sources with a second frequency and measuring the hysteresis curve of the inspected structure; 4) taking the difference between the first and second hysteresis curves; and 5) using known hysteresis curves of different materials to infer the ferromagnetic material type or grade from the measured hysteresis difference.

* * * * *